(12) United States Patent
Kido et al.

(10) Patent No.: US 6,337,268 B1
(45) Date of Patent: Jan. 8, 2002

(54) METHOD OF MANUFACTURING CONTACT STRUCTURE

(75) Inventors: Shigenori Kido; Jiro Matsufusa; Tomoharu Mametani; Yoji Nakata, all of Tokyo; Takeshi Kishida, Hyogo; Yukihiro Nagai, Tokyo; Akinori Kinugasa, Tokyo; Hiroaki Nishimura, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/610,701

(22) Filed: Jul. 5, 2000

(30) Foreign Application Priority Data

Dec. 27, 1999 (JP) ............................................ 11-370065

(51) Int. Cl.$^7$ ......................................... H01L 21/4763
(52) U.S. Cl. ........................ 438/618; 438/640; 438/701
(58) Field of Search ................................. 438/618, 626, 438/640, 700, 701, 737

(56) References Cited

U.S. PATENT DOCUMENTS

| 5,082,801 A | 1/1992 | Nagata |
| 5,502,006 A | 3/1996 | Kasagi |
| 5,672,241 A | 9/1997 | Tien et al. |
| 5,858,882 A | * | 1/1999 | Chang et al. |
| 6,143,666 A | * | 11/2000 | Lin et al. |

FOREIGN PATENT DOCUMENTS

| DE | 196 08 883 A1 | 1/1997 |
| EP | 0 523 856 A2 | 6/1992 |
| JP | 3-149826 A | 6/1992 |
| JP | 7-74172 | 3/1995 |
| JP | 7-704172 A | 3/1995 |
| JP | 7-122635 A | 5/1995 |

* cited by examiner

Primary Examiner—Caridad Everhart
(74) Attorney, Agent, or Firm—McDermott, Will & Emery

(57) ABSTRACT

A contact structure is formed with no voids in an interlayer insulation film and good surface planarity. A first insulation film (21) formed of p-TEOS is deposited to cover a substrate (1) and wires (4) formed on the substrate (1). A second insulation film (22) which is coating glass is formed by SOG. The surface is etched back from the opposite side to the substrate (1); therefore, the second insulation film (22) is etched. The etching is stopped at the point where the surface (21a) of the first insulation film (21) on the wires (4) is exposed. This ensures good surface,planarity. A third insulation film (23) is stacked on top of the second insulation film (22), and portions of the third insulation film (23) above the wires (4) are isotropically etched to form openings (51). At this time, the isotropic etching does not extend over the second insulation film (22).

9 Claims, 5 Drawing Sheets

METHOD OF MANUFACTURING CONTACT STRUCTURE

BACKGROUND OF THE INVENTION

1. Field of the Invention

The present invention relates to a technique for manufacturing a contact structure adopted in a multilayer interconnection structure.

2. Description of the Background Art

Conventionally, multilayer interconnection structures have adopted the so-called contact structure to establish electrical connections via an interlayer insulation film. FIGS. 8 to 10 are cross-sectional views showing, in the sequence of operations, a conventional method of manufacturing a contact structure.

On a substrate 1 for example formed of a semiconductor or insulator, a plurality of wires 4 are selectively provided. The substrate 1 and the wires 4 are covered with an interlayer insulation film 2 consisting of first to third insulation films 21 to 23 which are stacked on top of each other in this order. The first insulation film 21 and the third insulation film 23 are, for example, p-TEOS (tetraethylorthosilicate) oxide films doped with phosphorus, which are formed by CVD with TEOS as source gas. The second insulation film 22 is for example an insulation film formed by SOG (Spin-On-Glass). The use of such a multilayer structure allows the interlayer insulation film 2 to have excellent step coverage and good surface planarity.

On the third insulation film 23, a resist 3 is formed in such a pattern that portions of the third insulation film 23 above the wires 4 are exposed (FIG. 8).

In the contact structure, isotropic etching using the resist 3 as a mask (e.g., wet etching) is performed for such a reason that a taper is formed thereabove, whereby upwardly widened openings 51 are formed in the third insulation film 23 as shown in FIG. 8.

Then, the portions of the second insulation film 22 exposed to the openings 51 and further the corresponding portions of the first insulation film 21 are anisotropically etched in this order by dry etching, whereby openings 52 are formed in the first and second insulation films 21 and 22. This results in the structure shown in FIG. 10 in which the upper surfaces of the wires 4 are exposed to through holes 5 each consisting of the openings 51 and 52 which communicate with each other.

After the resist 3 is removed and the through holes 5 are filled with conductive materials, different wires are formed in contact with the conductive materials on the third insulation film 23. This provides electrical connections between the additional wires and the wires 4 via the conductive materials with the interlayer insulation film 2 therebetween, resulting in the formation of a contact structure in the multilayer interconnection structure.

The process shown in FIG. 9 (i.e., the process of forming the openings 51 in the third insulation film 23 by wet etching), however, has a problem that voids may be made between the first insulation film 21 and the third insulation film 23 since the second insulation film 22 once exposed can easily be etched.

To overcome this problem, Japanese Patent Laid-open No. P07-74172A, for example, has proposed a technique for etching back the whole surface after the formation of the second insulation film 22 on the first insulation film 21 and before the formation of the third insulation film 23. This technique allows only the portions of the second insulation film 22 above the wires 4 to be removed while leaving the second insulation film 22 between the adjacent wires 4. At this time, etch selectivity of both the second insulation film 22 and the wires 4 is set low; therefore, not only the second insulation film 22 but also the first insulation film 21 on the wires 4 are etched.

However, if the whole surface is etched back to the extent that the first insulation film 21 on the wires 4 is etched, the surface of the second insulation film 22 sandwitched between the adjacent wires 4 is likely to be below that of the first insulation film 21 on the wires 4 even if the etch selectivity is set low. This is undesirable in terms of surface planarity.

SUMMARY OF THE INVENTION

The present invention is directed to a method of manufacturing a contact structure, comprising the steps of: (a) selectively forming a plurality of wires on a substrate; (b) forming a first insulation film to cover the substrate and the wires, the first insulation film having an exposed surface on the opposite side to the substrate; (c) forming a second insulation film, which is coating glass, on the first insulation film; (d) etching back a structure obtained in the step (c) to expose portions of the surface above the wires; (e) forming a third insulation film on a structure obtained in the step (d); (f) forming, on the third insulation film, a mask having a pattern to expose portions of the third insulation film above the wires; (g) performing isotropic etching using the mask to form a first opening in the third insulation film, the first opening exposing a portion of the surface above each of the wires; (h) performing anisotropic etching through the first opening to form a second opening in the first insulation film, the second opening communicating with the first opening and exposing each of the wires; and (i) filling the first opening and the second opening with a conductive material and forming another wire in contact with the conductive material on the third insulation film.

According to the present invention, etching can be stopped with little removal of the first insulation film. This prevents the surface of the second insulation film sandwiched between the adjacent wires from being below that of the first insulation film on the wires, thereby ensuring good surface planarity. Further, the isotropic etching does not remove the second insulation film. This prevents the occurrence of voids in the interlayer insulation film consisting of the first to third insulation films, thereby allowing the formation of a contact structure that provides electrical connections between the wires and additional wires via the conductive material with the interlayer insulation film therebetween.

An object of the present invention is to provide a technique for obtaining a contact structure with no voids in the interlayer insulation film and good surface planarity.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1 to 7 are cross-sectional views showing, in the sequence of operations, a method of manufacturing a contact structure according to a preferred embodiment of the present invention.

On a substrate 1 for example formed of a semiconductor or insulator, a plurality of wires 4 are selectively formed. Following this, a first insulation film 21 for example formed of p-TEOS is deposited for example by plasma treatment to cover the substrate 1 and the wires 4. This results in the structure shown in FIG. 1 in which a surface 21a of the first insulation film 21 on the opposite side to the substrate 1 is exposed.

Figure 1:
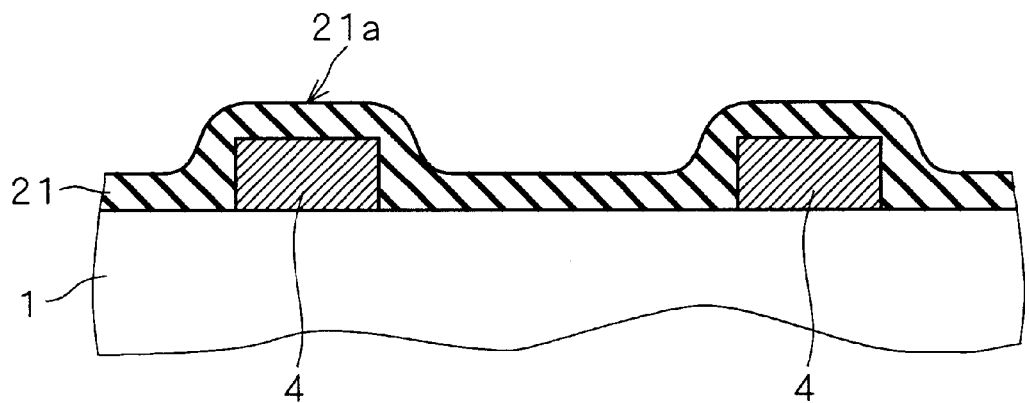
FIGS. 1 to 7 are cross-sectional views showing, in the sequence of operations, a method of manufacturing a contact structure according to a preferred embodiment of the present invention.
Figure 2:
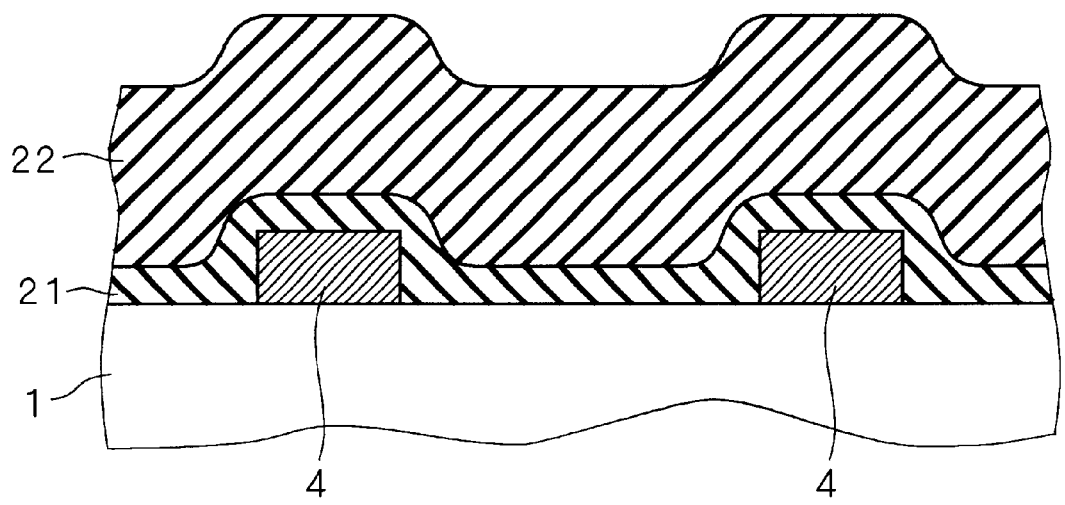

Then, a spin coating of an organic solvent with methylsiloxane polymer dissolved, for example, is applied and annealed on top of the first insulation film 21 to form a second insulation film or coating glass 22 by SOG. As shown in FIG. 2, the second insulation film 22 not only covers the portions of the first insulation film 21 on the wires 4 but also fills recesses which are formed between the adjacent wires 4 by the first insulation film 21. The surface of the second insulation film 22 on the opposite side to the substrate 1 is exposed.

Figure 3:
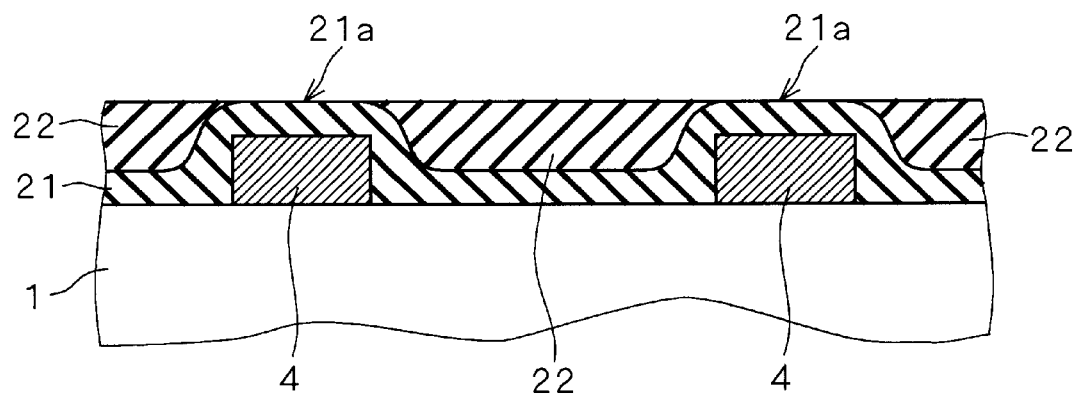
Figure 4:
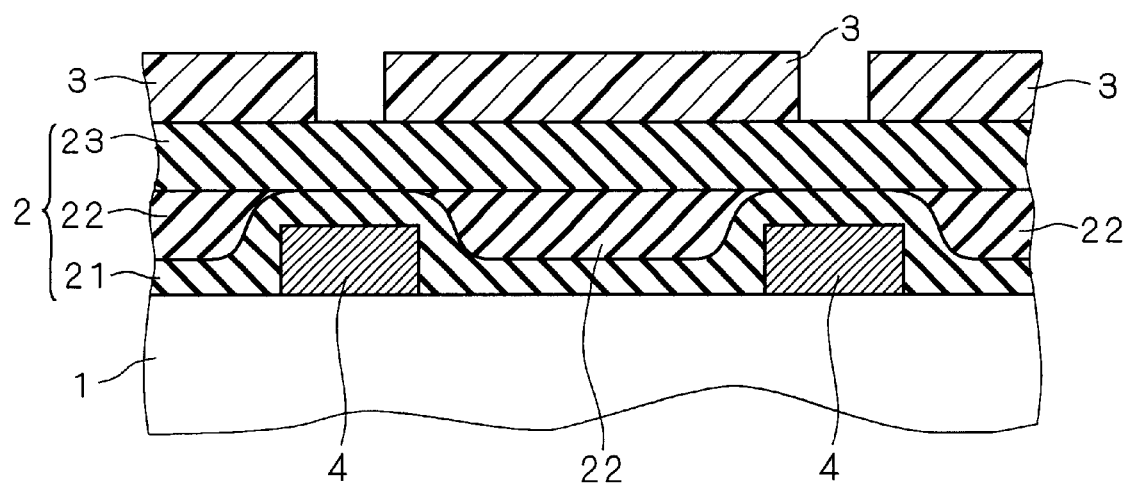

The structure shown in FIG. 2 is etched back from above, i.e., from the opposite side to the substrate 1; therefore, the second insulation film 22 is etched. This etching is stopped at the point where a surface 21a of the first insulation film 21 above the wires 4 is exposed. A resultant structure is shown in FIG. 3. Stopping of etching is implemented by controlling etching time. In the present invention, etching is stopped with little removal of the first insulation film 21. This prevents the surface of the second insulation film 22 sandwiched between the adjacent wires 4 from being below that of the first insulation film 21 on the wires 4, thereby ensuring good surface planarity.

Like the first insulation film 21, a third insulation film 23 is further formed on the first insulation film 21 and the second insulation film 22. On the third insulation film 23, further, a resist 3 is formed in such a pattern that portions of the third insulation film 23 above the wires 4 are exposed. This results in the structure shown in FIG. 4.

Figure 5:
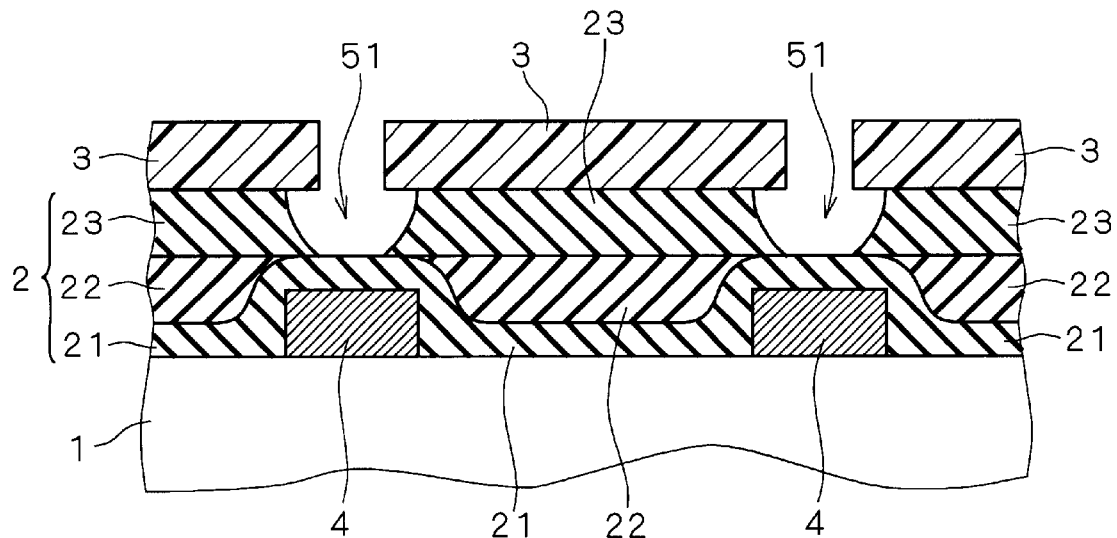
Figure 6:
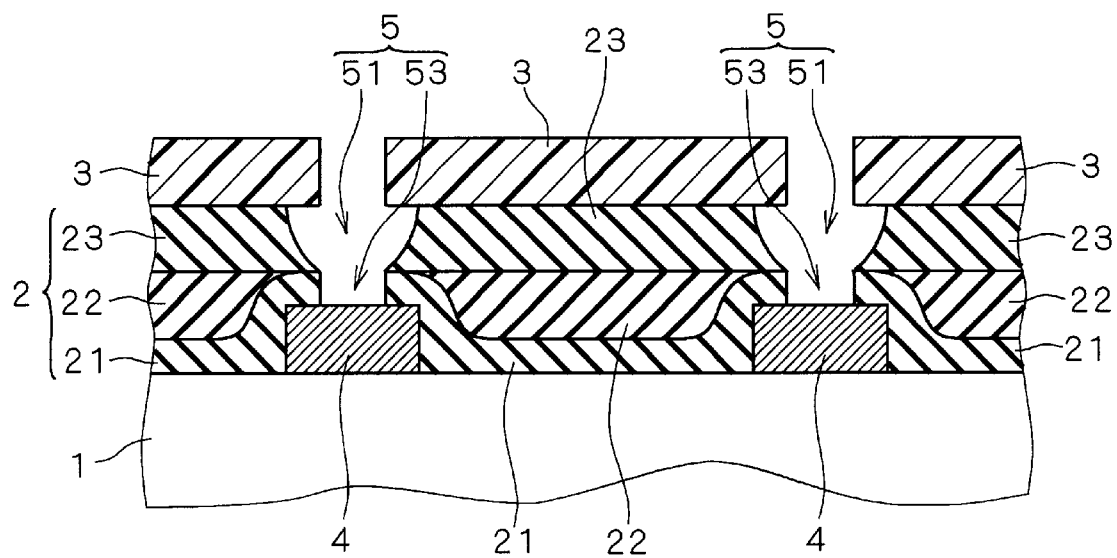

Then, isotropic etching using the resist 3 as a mask (e.g., wet etching) is performed, whereby upwardly widened openings 51 are formed in the third insulation film 23 as shown in FIG. 5. At this time, it is easy to control the size of openings of the resist 3 in patterning in consideration of the thickness of the third insulation film 23 so that the openings 51 expose only the first insulation film 21 without exposing the second insulation film 22. Thus, it is possible not to remove the second insulation film 22 by this isotropic etching, which prevents the occurrence of voids in the interlayer insulation film.

Further, portions of the first insulation film 21 exposed to the openings 51 are anisotropically etched for example by dry etching, whereby almost vertical openings 53 are formed in the first insulation film 21. This results in the structure shown in FIG. 6 in which the upper surfaces of the wires 4 are exposed to through holes 5 each consisting of the openings 51 and 53 which communicate with each other.

Figure 7:
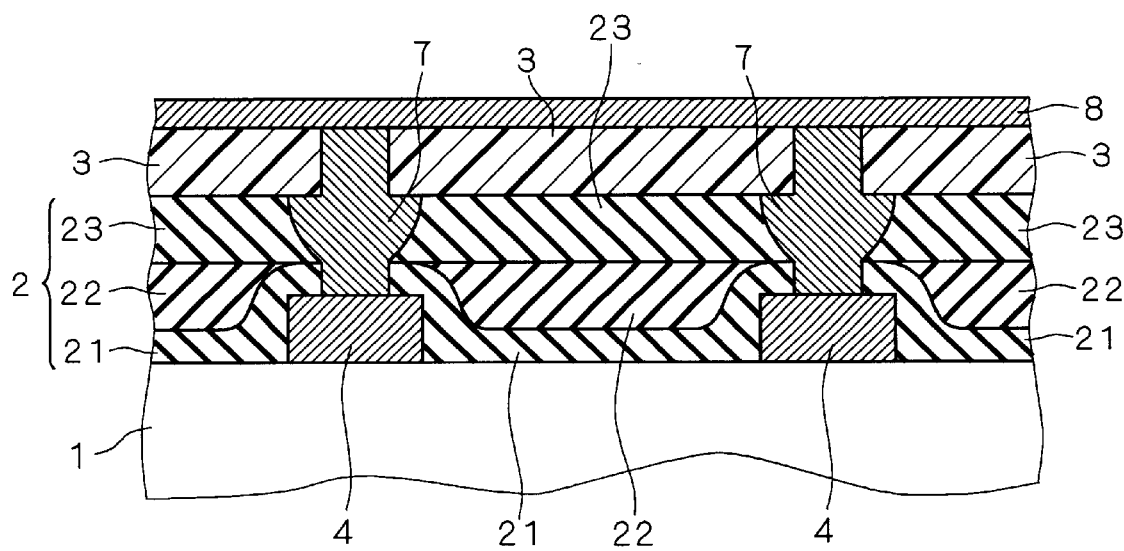
Figure 8:
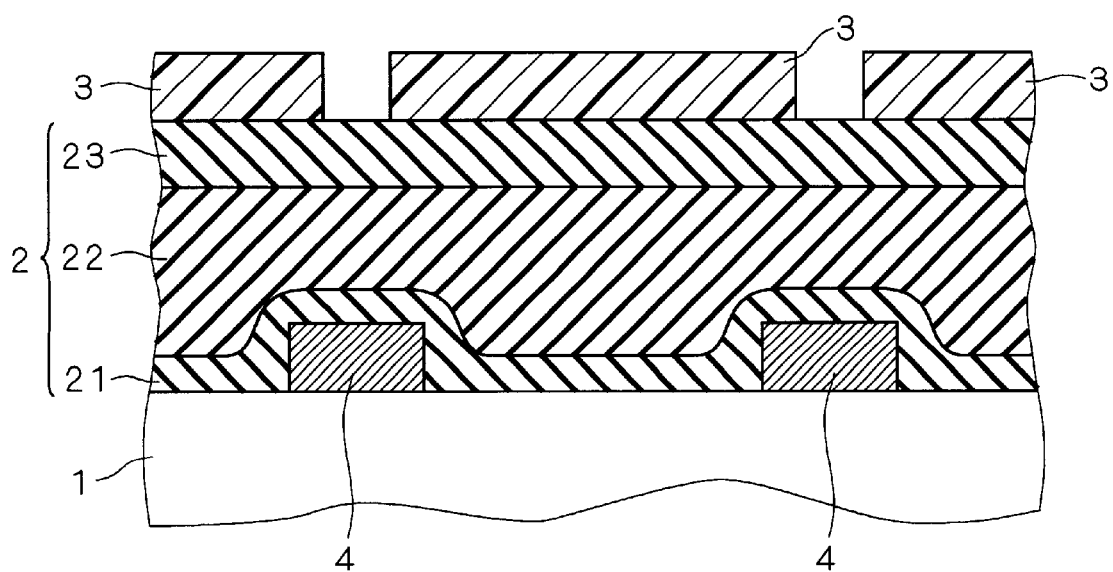
FIGS. 8 to 10 are cross-sectional views showing, in the sequence of operations, a conventional method of manufacturing a contact structure.
Figure 9:
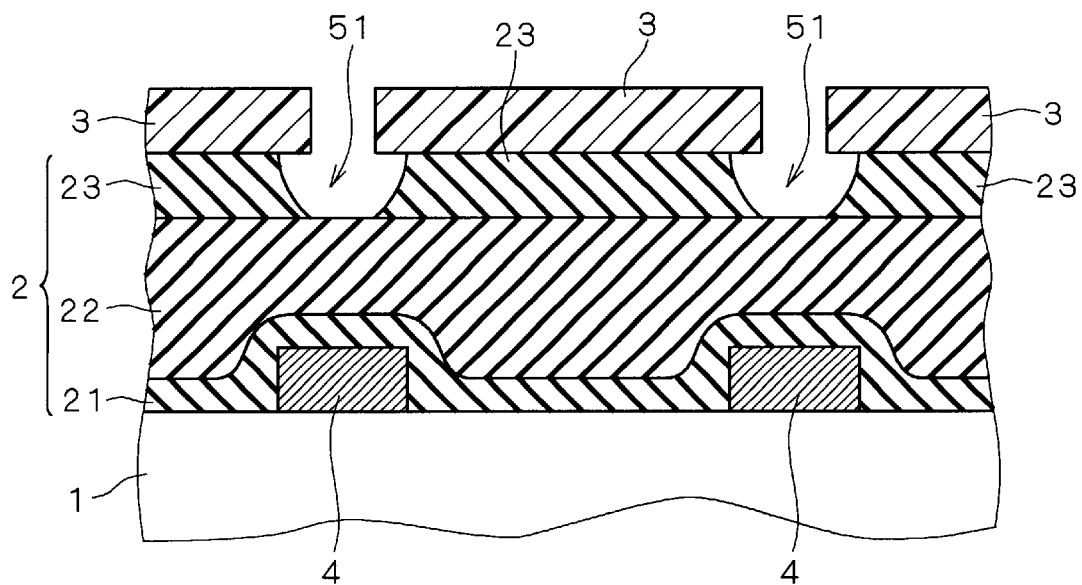
Figure 10:
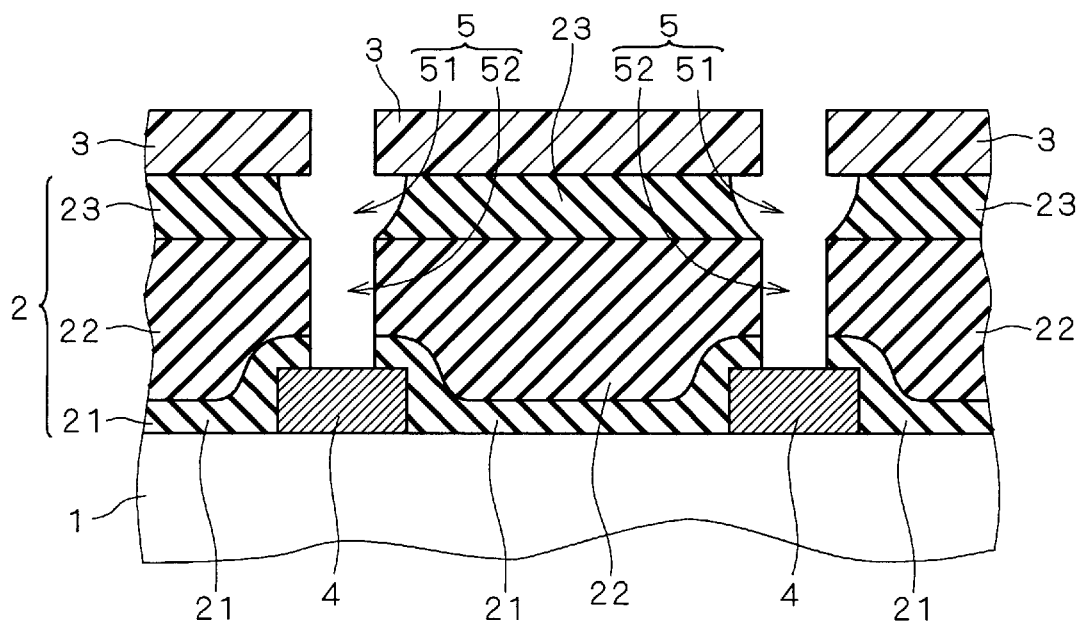

After the resist 3 is removed and the through holes 5 are filled with conductive materials 7, an additional wire 8 is formed in contact with the conductive materials on the third insulation film 23 (FIG. 7). This provides electrical connections between the additional wire 8 and the wires 4 via the conductive materials 7 with the interlayer insulation film 2 in-between, resulting in the formation of a contact structure in the multilayer structure.

The coating glass adopted as the second insulation film 22 may be either organic glass or inorganic glass. Further, the oxide film formed by CVD with TEOS as source gas, which is adopted as the first or third insulation film 21, 23, may be doped with boron instead of phosphorus or may be doped with both of them.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a contact structure, comprising the steps of:
    (a) selectively forming a plurality of wires on a substrate;
    (b) forming a first insulation film to cover said substrate and said wires, said first insulation film having an exposed surface on the opposite side to said substrate;
    (c) forming a second insulation film, which is coating glass, on said first insulation film;
    (d) etching back a structure obtained in said step (c) to expose portions of said surface above said wires;
    (e) forming a third insulation film on a structure obtained in said step (d);
    (f) forming, on said third insulation film, a mask having a pattern to expose portions of said third insulation film above said wires;
    (g) performing isotropic etching using said mask to form a first opening in said third insulation film, said first opening exposing a portion of said surface above each of said wires;
    (h) performing anisotropic etching through said first opening to form a second opening in said first insulation film, said second opening communicating with said first opening and exposing each of said wires; and
    (i) filling said first opening and said second opening with a conductive material and forming another wire in contact with said conductive material on said third insulation film.

2. The method according to claim 1, wherein
in said step (b), said first insulation film forms a recess between said wires.

3. The method according to claim 2, wherein
in said step (c), said second insulation film fills said recess.

4. The method according to claim 3, wherein
said second insulation film is formed by SOG.

5. The method according to claim 3, wherein
in said step (d), said second insulation film is planarized with said first insulation film.

6. The method according to claim 5, wherein
in said step (e), said third insulation film is formed of the same material as said first insulation film.

7. The method according to claim 6, wherein
said first insulation film is formed of a TEOS film.

8. The method according to claim 1, wherein
in said step (g), said surface exposed to said first opening is smaller than top faces of said wires.

9. The method according to claim 8, wherein
in said step (h), said second opening exposes only said wires.

* * * * *